(12) United States Patent
Ookawa

(10) Patent No.: US 9,486,989 B2
(45) Date of Patent: Nov. 8, 2016

(54) BONDING METHOD, BONDING APPARATUS, AND BONDING SYSTEM

(71) Applicant: TOKYO ELECTRON LIMITED, Tokyo (JP)

(72) Inventor: Satoshi Ookawa, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 184 days.

(21) Appl. No.: 14/274,895

(22) Filed: May 12, 2014

(65) Prior Publication Data

US 2014/0338813 A1    Nov. 20, 2014

(30) Foreign Application Priority Data

May 16, 2013 (JP) ................. 2013-103861

(51) Int. Cl.
*H01L 21/683* (2006.01)
*B32B 37/10* (2006.01)
*H01L 21/67* (2006.01)
*H01L 21/677* (2006.01)
*H01L 21/68* (2006.01)
*G02F 1/13* (2006.01)
*B32B 38/18* (2006.01)

(52) U.S. Cl.
CPC .......... *B32B 37/10* (2013.01); *H01L 21/6719* (2013.01); *H01L 21/67092* (2013.01); *H01L 21/67126* (2013.01); *H01L 21/67748* (2013.01); *H01L 21/681* (2013.01); *H01L 21/6831* (2013.01); *B32B 38/18* (2013.01); *B32B 2309/68* (2013.01); *B32B 2315/08* (2013.01); *B32B 2457/14* (2013.01); *G02F 1/1303* (2013.01); *Y10T 156/10* (2015.01)

(58) Field of Classification Search
CPC .......... H01L 21/6831; H01L 21/6833; H01L 21/68; H01L 21/683; H01L 21/6835; H01L 2221/683; H01L 2221/68304; H01L 2221/68327; B32B 2037/1063; G02F 1/1303
See application file for complete search history.

(56) References Cited

U.S. PATENT DOCUMENTS

| 2008/0124198 | A1* | 5/2008 | Kim ................. H01L 21/67092 414/217.1 |
| 2010/0109220 | A1* | 5/2010 | Musha ................. B65G 49/061 269/7 |
| 2013/0071996 | A1* | 3/2013 | Deguchi ............. B32B 38/0036 438/455 |

FOREIGN PATENT DOCUMENTS

| JP | 2002-229471 A | 8/2002 |
| JP | 2003-270609 A | 9/2003 |
| JP | 2012-160628 A | 8/2012 |
| WO | 2008/129989 A1 | 10/2008 |
| WO | 2010/055730 A1 | 5/2010 |

* cited by examiner

*Primary Examiner* — Carson Gross
(74) *Attorney, Agent, or Firm* — Nath, Goldberg & Meyer; Jerald L. Meyer

(57) ABSTRACT

A bonding method includes: holding a substrate to be processed by a first holding unit; holding a glass substrate by a second holding unit in a first holding state of seating the glass substrate thereon or in a second holding state of electrostatically attracting the glass substrate; depressurizing the interior of a chamber; and bringing the substrate to be processed and the glass substrate into contact with each other and pressing them. Holding a glass substrate includes: switching from the first holding state to the second holding state during at least one predetermined period of time selected from a plurality of predetermined periods of time, the plurality of predetermined periods of time including a pressure change timing in depressurizing the interior of a chamber and a pressing timing in bonding the substrate to be processed and the glass substrate.

8 Claims, 8 Drawing Sheets

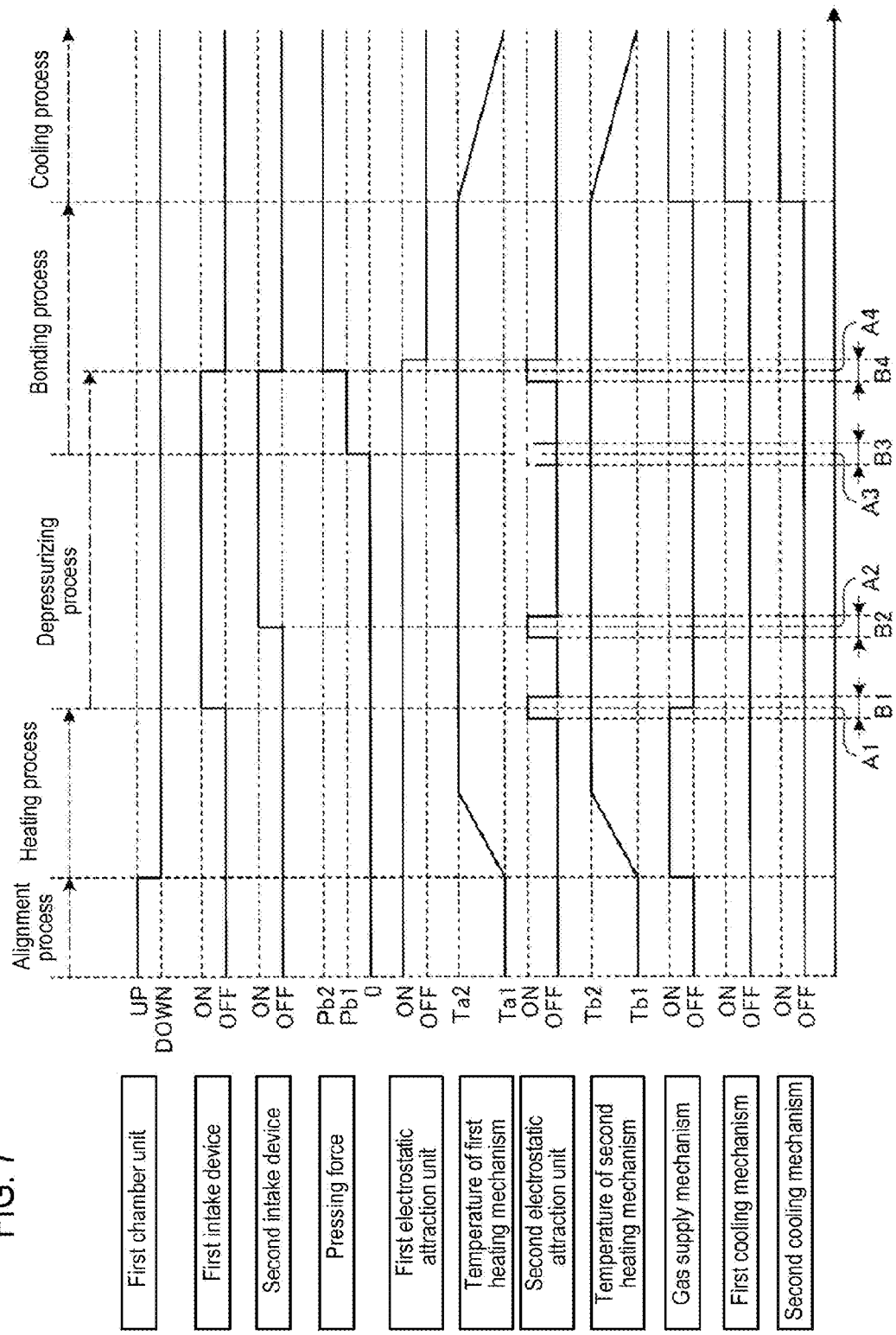

BONDING METHOD, BONDING APPARATUS, AND BONDING SYSTEM

CROSS-REFERENCE TO RELATED APPLICATION

This application claims the benefit of Japanese Patent Application No. 2013-103861, filed on May 16, 2013, in the Japan Patent Office, the disclosure of which is incorporated herein in its entirety by reference.

TECHNICAL FIELD

The present disclosure relates to a bonding method, a bonding apparatus, and a bonding system.

BACKGROUND

Recently, in a process of manufacturing a semiconductor device, a substrate to be processed (or a target substrate) such as a silicon wafer or a compound semiconductor wafer has been increased in diameter and reduced in thickness. However, a target substrate having a large diameter and a small thickness may be bent or cracked when transferred or polished. Due to this, a support substrate such as a glass substrate is bonded to a target substrate to reinforce the target substrate.

For example, there is a method of holding a target substrate and a glass substrate respectively with an upper chuck and a lower chuck, placing the upper chuck and the lower chuck to be close to each other, and pressing the target substrate and the glass substrate to bond both substrates. A glue (or an adhesive), for example, is applied to the surfaces of the target substrate and the glass substrate, and as mentioned above, the target substrate and the glass substrate are bonded through pressing.

There has been also suggested a method of installing a heating mechanism in the upper chuck and the lower chuck and heating the target substrate and the glass substrate to bond them.

However, in the aforementioned methods, when an electrostatic chuck is employed as a holding unit of the glass substrate, the glass substrate is electrostatically held by the electrostatic chuck at a high temperature. Therefore, sodium may be extracted from the glass substrate, which may result in defects, for example, degradation of a surface of the electrostatic chuck, corruption of the glass substrate, or the like.

SUMMARY

Some embodiments of the present disclosure provide a bonding method, a bonding apparatus, and a bonding system capable of suppressing extraction of sodium from a glass substrate.

According to an aspect of the present disclosure, there is provided a bonding method, including: holding a substrate to be processed by a first holding unit; holding a glass substrate by a second holding unit in a first holding state of seating the glass substrate on the second holding unit or in a second holding state of electrostatically attracting the glass substrate toward the second holding unit; depressurizing the interior of a chamber for accommodating the substrate to be processed held by the first holding unit and the glass substrate held by the second holding unit; and bringing the substrate to be processed and the glass substrate into contact with each other and pressing the substrate to be processed and the glass substrate to bond the substrate to be processed and the glass substrate. Holding a glass substrate includes: switching from the first holding state to the second holding state during at least one period of time selected from a plurality of predetermined periods of time, the plurality of predetermined periods of time including a pressure change timing at which a pressure within the chamber is changed in depressurizing the interior of a chamber and a pressing timing at which the substrate to be processed and the glass substrate are pressed in bonding the substrate to be processed and the glass substrate.

According to another aspect of the present disclosure, there is provided a bonding apparatus, including: a first holding unit configured to hold a substrate to be processed; a second holding unit disposed below the first holding unit to face the first holding unit and configured to hold a glass substrate in a first holding state of seating the glass substrate on the second holding unit or in a second holding state of electrostatically attracting the glass substrate toward the second holding unit; a chamber configured to accommodate the substrate to be processed held by the first holding unit and the glass substrate held by the second holding unit; a depressurizing mechanism configured to depressurize the interior of the chamber; a pressing mechanism configured to move the first holding unit with respect to the second holding unit to bring the substrate to be processed and the glass substrate into contact with each other and to press the substrate to be processed and the glass substrate, so that the substrate to be processed and the glass substrate are bonded; and a controller configured to control the first holding unit, the second holding unit, the depressurizing mechanism and the pressing mechanism. The controller is configured to switch from the first holding state to the second holding state during at least one predetermined period of time selected from a plurality of predetermined periods of time, the plurality of predetermined periods of time including a pressure change timing at which a pressure within the chamber is changed by the depressurizing mechanism and a pressing timing at which the substrate to be processed and the glass substrate are pressed by the pressing mechanism.

According to still another aspect of the present disclosure, there is provided a bonding system, including: a loading/unloading station configured to seat a substrate to be processed and a glass substrate thereon; a substrate transfer device configured to transfer the substrate to be processed and the glass substrate seated on the loading/unloading station; a bonding station in which a bonding apparatus configured to bond the substrate to be processed and the glass substrate transferred by the substrate transfer device is installed; and a controller configured to control the boding apparatus. The bonding apparatus includes: a first holding unit configured to hold the substrate to be processed; a second holding unit disposed below the first holding unit to face the first holding unit and configured to hold the glass substrate in a first holding state of seating the glass substrate on the second holding unit or in a second holding state of electrostatically attracting the glass substrate toward the second holding unit; a chamber configured to accommodate the substrate to be processed held by the first holding unit and the glass substrate held by the second holding unit; a depressurizing mechanism configured to depressurize the interior of the chamber; and a pressing mechanism configured to move the first holding unit with respect to the second holding unit to bring the substrate to be processed and the glass substrate into contact with each other and to press the substrate to be processed and the glass substrate, so that the substrate to be processed and the glass substrate are bonded.

The controller is configured to switch from the first holding state to the second holding state during at least one predetermined period of time selected from a plurality of predetermined periods of time, the plurality of predetermined periods of time including a pressure change timing at which a pressure within the chamber is changed by the depressurizing mechanism and a pressing timing at which the substrate to be processed and the glass substrate are pressed by the pressing mechanism.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is a timing chart illustrating a substrate bonding sequence according to an embodiment of the present disclosure.

DETAILED DESCRIPTION

Reference will now be made in detail to various embodiments of a bonding method, a bonding apparatus and a bonding system according to the present disclosure, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<1. Configuration of Bonding System>

Figure 1:
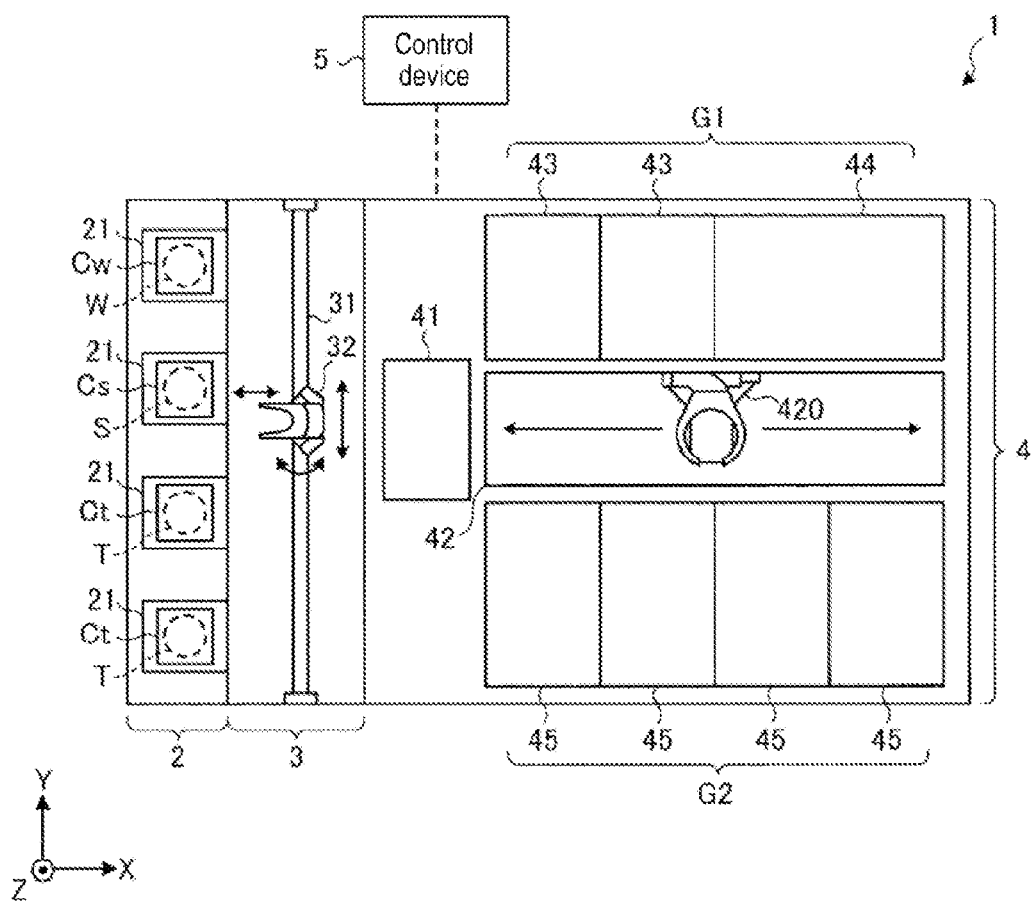
FIG. 1 is a schematic plan view illustrating a configuration of a bonding system according to an embodiment of the present disclosure.
Figure 2:
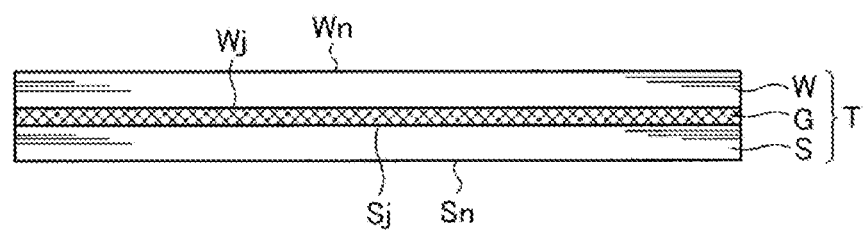
FIG. 2 is a schematic side view illustrating a substrate to be processed (or a target substrate) and a glass substrate.

First, a configuration of a bonding system according to an embodiment of the present disclosure will be described with reference to FIGS. 1 and 2. FIG. 1 is a schematic plan view illustrating a configuration of a bonding system according to the embodiment. FIG. 2 is a schematic side view illustrating a substrate to be processed (or a target substrate) and a glass substrate. In the following description, in order to clarify positional relationships, an X axis direction, a Y axis direction, and a Z axis direction perpendicular to one another will be defined, and the Z axis positive direction will be set as a vertical upward direction.

A bonding system 1 according to the embodiment illustrated in FIG. 1 bonds a target substrate W and a glass substrate S (see FIG. 2) through a glue G to form a superposed substrate T.

Hereinafter, as illustrated in FIG. 2, among surfaces of the target substrate W, a surface bonded with the glass substrate S through the glue G will be referred to as a "bonding surface Wj", and a surface opposite the bonding surface Wj will be referred to as a "non-bonding surface Wn". Also, among surfaces of the glass substrate S, a surface bonded with the target substrate W through the glue G will be referred to as a "bonding surface Sj", and the surface opposite the bonding surface Sj will be referred to as a "non-bonding surface Sn".

The target substrate W is a substrate in which a plurality of electronic circuits is formed on a semiconductor substrate such as a silicon wafer or a compound semiconductor wafer, and a surface on which the electronic circuits are formed is the bonding surface Wj. The non-bonding surface Wn of the target substrate W is polished after the glass substrate S is bonded to the target substrate W, so that the target substrate W becomes thin.

The glass substrate S functions as a support substrate and is a substrate having a diameter almost equal to that of the target substrate W, and supports the target substrate W. Further, a thermoplastic resin, for example, may be used as the glue G.

As illustrated in FIG. 1, the bonding system 1 includes a loading/unloading station 2, a first transfer region 3 and a bonding station 4. The loading/unloading station 2, the first transfer region 3 and the bonding station 4 are integratedly connected in this order in the X axis positive direction.

The loading/unloading station 2 is a place where cassettes Cw, Cs and Ct for accommodating a plurality of substrates (for example, twenty-five sheets of substrates) in a horizontal state are seated. For example, four cassette pedestals 21 are arranged in a line in the loading/unloading station 2. In each cassette pedestal 21, one of the cassette Cw for accommodating the target substrate W, the cassette Cs for accommodating the glass substrate S, and the cassette Ct for accommodating the superposed substrate T is seated.

The number of cassette pedestals 21 may be arbitrary. Also, although the cassettes Ct are seated on two of the four cassette pedestals 21 in the example illustrated FIG. 1, a cassette for recovering a defective substrate, for example, may be seated on one of the two cassette pedestals 21.

In the first transfer region 3, a transfer path 31 extending in the Y axis direction and a first transfer device 32 movable along the transfer path 31 is disposed. The first transfer device 32 is also movable in the X axis direction, and rotates about the Z axis. The first transfer device 32 transfers the target substrate W, the glass substrate S and the superposed substrate T between the cassettes Cw, Cs and Ct seated on the cassette pedestals 21 and a first delivery unit 41 of the bonding station 4 as described later.

The bonding station 4 includes the first delivery unit 41 and a second transfer region 42. The bonding station 4 further includes a coating/heating process block G1 and a bonding process block G2.

The first delivery unit 41 is disposed between the first transfer region 3 and the second transfer region 42. The first delivery unit 41 delivers the target substrate W, the glass substrate S and the superposed substrate T between the first transfer device 32 of the first transfer region 3 and a second transfer device 420 of the second transfer region 42 as described later.

The second transfer device 420 is disposed in the second transfer region 42. The second transfer device 420 is movable in the X axis direction and the Y axis direction, and rotates about the Z axis. The second transfer device 420 transfers the target substrate W, the glass substrate S and the superposed substrate T between the first delivery unit 41, the coating/heating process block G1 and the bonding process block G2.

The coating/heating process block G1 and the bonding process block G2 are disposed to face each other with the second transfer region 42 interposed therebetween.

In the coating/heating process block G1, two coating devices 43 and one heat treatment device 44 are arranged in a line to be adjacent to the second transfer region 42. The coating device 43 is a device for coating the glue G to the bonding surface Wj of the target substrate W, and the heat treatment device 44 is a device for heating the target substrate W with the glue G coated thereon at a predetermined temperature.

In the bonding process block G2, four bonding apparatuses 45 are arranged in a line to be adjacent to the second transfer region 42. The bonding apparatuses 45 bond the target substrate W and the glass substrate S. A detailed configuration of the bonding apparatus 45 will be described later.

The bonding system 1 further includes a control device 5. The control device 5 controls an operation of the bonding system 1. The control device 5 is, for example, a computer, and includes a controller and a storage unit (not shown). The storage unit stores a program for controlling various processes such as a bonding process. The controller controls an operation of the bonding system 1 by reading and executing the program stored in the storage unit.

The aforementioned program may be recorded in a computer-readable recording medium, and may be installed from the recording medium to the storage unit of the control device 5. The computer-readable recording medium includes, for example, a hard disk (HD), a floppy disk (FD), a compact disk (CD), a magneto optical (MO) disk, a memory card, and the like.

In the bonding system 1 configured as described above, first, the first transfer device 32 of the first transfer region 3 takes the target substrate W out of the cassette Cw seated on the cassette pedestal 21, and transfers the target substrate W to the first delivery unit 41. Here, the target substrate W is transferred in a state where the non-bonding surface Wn faces downwards.

The target substrate W transferred to the first delivery unit 41 is taken out of the first delivery unit 41 by the second transfer device 420 and loaded into the coating device 43 of the coating/heating process block G1. The coating device 43 includes, for example, a spin chuck, for adsorptively holding the non-bonding surface Wn of the target substrate W. The coating device 43 supplies the liquid glue G to the bonding surface Wj of the target substrate W, while rotating the target substrate W adsorptively held by the spin chuck. Accordingly, the glue G is applied and spread on the bonding surface Wj of the target substrate W.

After the glue G is coated by the coating device 43, the target substrate W is taken out of the coating device 43 by the second transfer device 420 and carried into the heat treatment device 44. The heat treatment device 44 heats the target substrate W in the interior thereof, which is held, for example, under an inert atmosphere, to volatilize a solvent such as an organic solvent included in the glue G, thereby hardening the glue G, relative to that when coated. Thereafter, the target substrate W is temperature-adjusted to a predetermined temperature, for example, room temperature, by the heat treatment device 44.

After the heat treatment is performed by the heat treatment device 44, the target substrate W is taken out of the heat treatment device 44 by the second transfer device 420 and loaded into the bonding apparatus 45.

Meanwhile, the glass substrate S is taken out of the cassette Cs by the first transfer device 32 and transferred to the first delivery unit 41. Then, the glass substrate S is taken out of the first delivery unit 41 by the second transfer device 420 and loaded into the bonding apparatus 45.

When the target substrate W and the glass substrate S are loaded into the bonding apparatus 45, the bonding apparatus 45 bonds the target substrate W and the glass substrate S. Accordingly, the superposed substrate T is formed. Thereafter, the superposed substrate T is transferred to the first delivery unit 41 by the second transfer device 420, and then transferred to the cassette Ct by the first transfer device 32. In this manner, a series of processes is terminated.

<2. Configuration of Bonding Apparatus>

Figure 3:
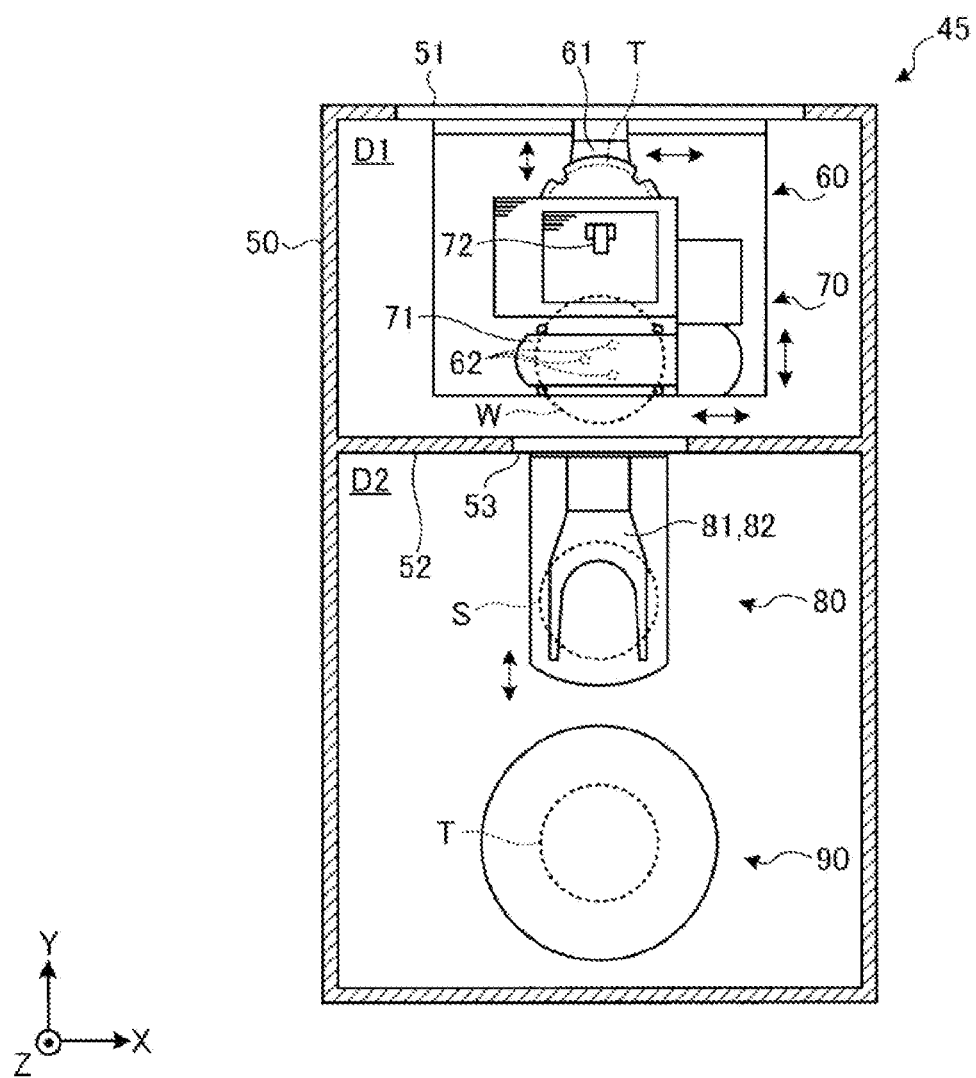
FIG. 3 is a schematic plan cross-sectional view illustrating a configuration of a bonding apparatus.

Next, a configuration of the bonding apparatus 45 will be described with reference to FIG. 3. FIG. 3 is a schematic plan cross-sectional view illustrating a configuration of the bonding apparatus 45.

As illustrated in FIG. 3, the bonding apparatus 45 includes a process chamber 50 whose interior may be hermetically sealed. A transfer port 51 for transferring therethrough the target substrate W, the glass substrate S and the superposed substrate T is formed on a side of the process chamber 50 facing the second transfer region 42. A shutter (not shown) is installed in the transfer port 51.

An inner wall 52 may be installed within the process chamber 50 to divide the interior of process chamber 50 into a pre-processing region D1 and a bonding region D2. A transfer port 53 for transferring therethrough the target substrate W, the glass substrate S and the superposed substrate T is formed in the inner wall 52. In the case where the inner wall 52 is installed, a shutter (not shown) is installed in the transfer port 53. Also, the transfer port 51 is formed on the lateral surface of the pre-processing region D1 in the process chamber 50.

In the pre-processing region D1, a delivery unit 60 for delivering the target substrate W, the glass substrate S and the superposed substrate T between the bonding apparatus 45 and the outside thereof is installed. The delivery unit 60 is disposed to be adjacent to the transfer port 51.

The delivery unit 60 includes a delivery arm 61 and support pins 62. The delivery arm 61 delivers the target substrate W, the glass substrate S and the superposed substrate T between the second transfer device 420 (see FIG. 1) and the support pins 62. The support pins 62 are installed in a plurality of places, for example, three places, to support the target substrate W, the glass substrate S and the superposed substrate T.

A plurality of delivery units 60 may be arranged in multiple stages, for example, two stages, in a vertical direction to simultaneously deliver any two of the target substrates W, the glass substrate S and the superposed substrate T. For example, one delivery unit 60 may deliver the target substrate W and the glass substrate S prior to being subjected to the bonding process, while another delivery unit 60 may deliver the superposed substrate T after the bonding process. Alternatively, the delivery of the target substrate W and the glass substrate S prior to being subjected to the bonding process may be carried out by different delivery units 60.

A reversing unit 70 for reversing front and rear surfaces of the target substrate W, for example, is installed in the Y axis negative direction of the pre-processing region D1, i.e., in the transfer port 53 side.

The reversing unit 70 includes a holding arm 71 for holding the target substrate W or the glass substrate S inserted therein. The holding arm 71 extends in a horizontal direction (X axis direction in FIG. 3). The holding arm 71 rotates about the horizontal axis, and is movable in the horizontal direction (X axis direction and Y axis direction) and in the vertical direction (Z axis direction).

Also, the reversing unit 70 has an adjustment function of adjusting a horizontal orientation of the target substrate W or the glass substrate S. Specifically, the reversing unit 70 includes a detection unit 72 for detecting a position of a notch of the glass substrate S or the target substrate W. The reversing unit 70 detects a position of the notch using the detection unit 72 while moving the glass substrate S or the target substrate W held in the holding arm 71 in the horizontal direction, thus adjusting the horizontal orientation of the target substrate W or the glass substrate S by aligning the notch to a predetermined position.

A transfer unit 80 for transferring the target substrate W, the glass substrate S and the superposed substrate T with respect to the delivery unit 60, the reversing unit 70 and a bonding unit 90 as described later is installed in a Y axis positive directional side of the bonding region D2. The transfer unit 80 is disposed to be adjacent to the transfer port 53.

The transfer unit 80 has two transfer arms 81 and 82. These transfer arms 81 and 82 are disposed in two stages in this order from below in a vertical direction, and may be movable in the horizontal direction and in the vertical direction by a driving unit (not shown).

Among the transfer arms 81 and 82, the transfer arm 81, for example, transfers the glass substrate S by holding the rear surface of the glass substrate S, i.e., the non-bonding surface Sn. Also, the transfer arm 82 transfers the target substrate W by holding a peripheral portion of the front surface of the target substrate W with the front and rear surfaces thereof reversed by the reversing unit 70, i.e., the bonding surface Wj.

The bonding unit 90 for bonding the target substrate W and the glass substrate S is installed in the Y axis negative direction side of the bonding region D2.

In the bonding apparatus 45 configured as described above, when the target substrate W is delivered to the delivery arm 61 of the delivery unit 60 by the second transfer device 420, the delivery arm 61 delivers the target substrate W to the support pins 62. Thereafter, the target substrate W is transferred from the support pins 62 to the reversing unit 70 by the transfer arm 81 of the transfer unit 80.

As for the target substrate W transferred to the reversing unit 70, a position of the notch is detected by the detection unit 72 of the reversing unit 70, and the horizontal orientation of the target substrate W is adjusted. Thereafter, the front and rear surfaces of the target substrate W are reversed by the reversing unit 70. That is, the bonding surface Wj faces downwards.

Thereafter, the target substrate W is transferred from the reversing unit 70 to the bonding unit 90 by the transfer arm 82 of the transfer unit 80. In this case, since the transfer arm 82 holds the peripheral portion of the target substrate W, the bonding surface Wj can be prevented from being contaminated by particles or the like attached on the transfer arm 82, for example.

Meanwhile, when the glass substrate S is delivered to the delivery arm 61 of the delivery unit 6 by the second transfer device 420, the delivery arm 61 delivers the glass substrate S to the support pins 62. Thereafter, the glass substrate S is transferred from the support pins 62 to the reversing unit 70 by the transfer arm 81 of the transfer unit 80.

As for the glass substrate S transferred to the reversing unit 70, a position of the notch is detected by the detection unit 72 of the reversing unit 70, such that the horizontal orientation of the glass substrate S is adjusted. Thereafter, the glass substrate S is transferred from the reversing unit 70 to the bonding unit 90 by the transfer arm 81 of the transfer unit 80.

When loading of the target substrate W and the glass substrate S to the bonding unit 90 is completed, the target substrate W and the glass substrate S are bonded by the bonding unit 90 to form the superposed substrate T. The formed superposed substrate T is transferred from the bonding unit 90 to the delivery unit 60 by the transfer arm 81 of the transfer unit 80, and then delivered to the delivery arm 61 through the support pins 62 and also delivered from the delivery arm 61 to the second transfer device 420.

<3. Configuration of Bonding Unit>

Figure 4:
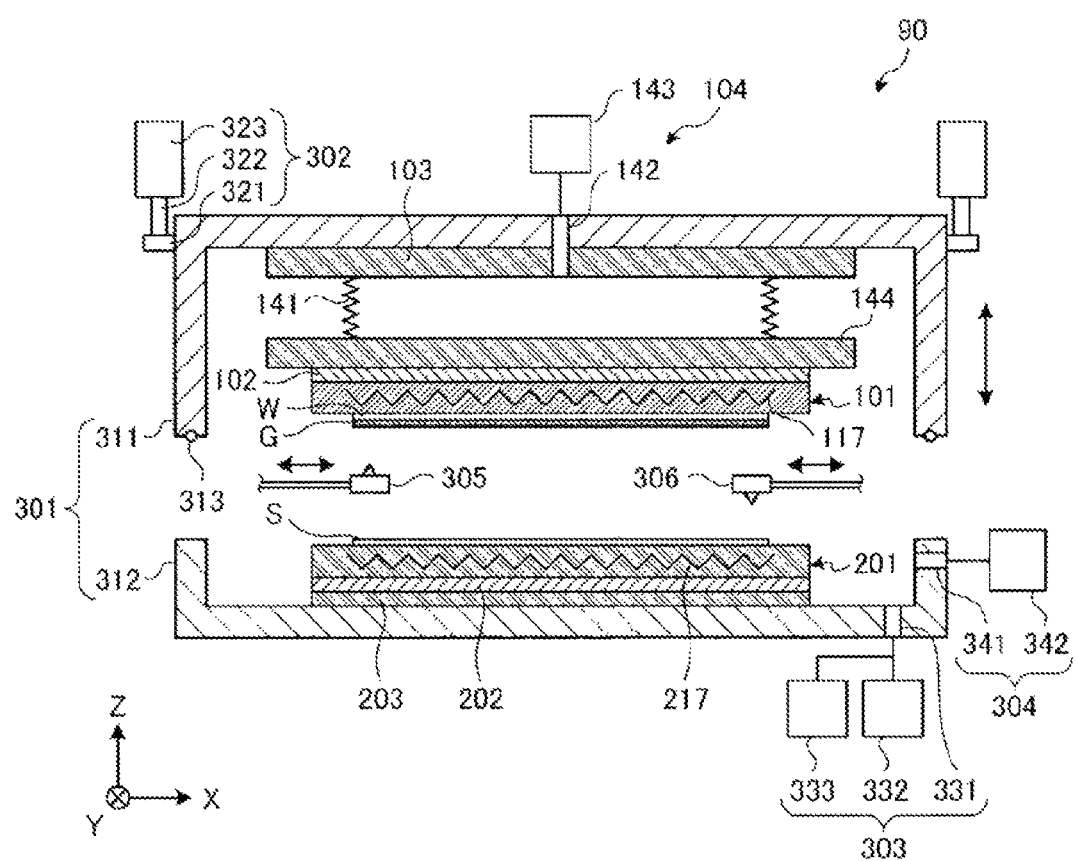
FIG. 4 is a schematic side-sectional view illustrating a configuration of a bonding unit.

Next, a configuration of the bonding unit 90 will be described with reference to FIG. 4. FIG. 4 is a schematic side-sectional view illustrating a configuration of the bonding unit 90. In FIG. 4, only essential components for describing the features of the bonding unit 90 are illustrated, and illustration of general components is omitted.

As illustrated in FIG. 4, the bonding unit 90 includes a first holding unit 101 and a second holding unit 201. The first holding unit 101 holds an upper surface side (specifically, the non-bonding surface Wn side) of the target substrate W in the vertical direction. Also, the second holding unit 201 is disposed below the first holding unit 101 to face the first holding unit 101, and holds a lower surface side (specifically, the non-bonding surface Sn side) of the glass substrate S in the vertical direction. The first holding unit 101 and the second holding unit 201 may have a substantially disc-like shape having a diameter greater than those of the target substrate W and the glass substrate S.

The first holding unit 101 and the second holding unit 201 are electrostatic chucks, and hold the target substrate W and the glass substrate S, respectively, through electrostatic attraction. When the electrostatic attraction is released, the second holding unit 201 holds the glass substrate S by seating the glass substrate S thereon. That is, the second holding unit 201 is configured to switch between holding the glass substrate S by seating it thereon (hereinafter, simply referred to as "by seating") and holding the glass substrate S by electrostatic attraction. The switch timing of the second holding unit 201 between holding the glass substrate S by seating and holding the glass substrate S by electrostatic attraction will be described in detail below.

Figure 5A:
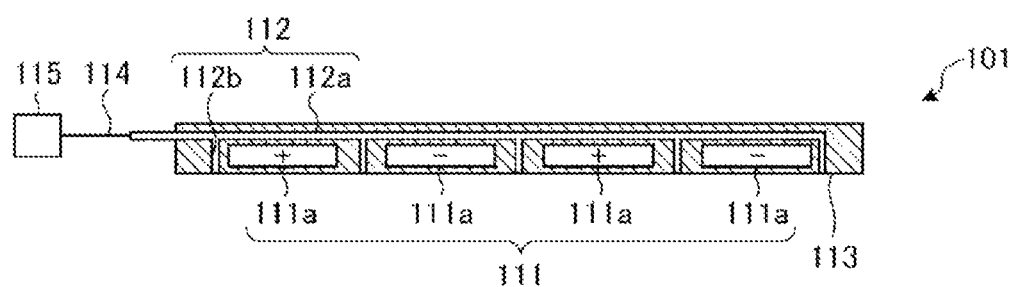
FIG. 5A is a schematic side-sectional view illustrating a configuration of a first holding unit.

Here, configurations of the first holding unit 101 and the second holding unit 201 will be described with reference to FIGS. 5A and 5B. FIG. 5A is a schematic side-sectional view illustrating a configuration of the first holding unit 101, and FIG. 5B is a schematic side-sectional view illustrating a configuration of the second holding unit 201.

Figure 5B:
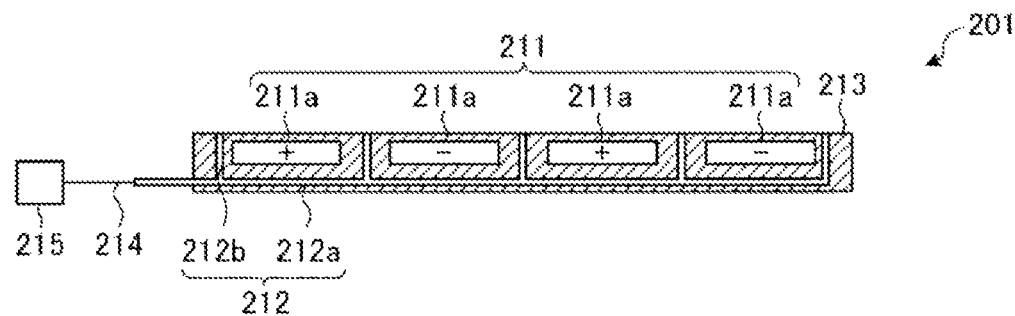
FIG. 5B is a schematic side-sectional view illustrating a configuration of a second holding unit.

As illustrated in FIGS. 5A and 5B, the first holding unit 101 includes a first electrostatic attraction unit 111, and the second holding unit 201 includes a second electrostatic attraction unit 211.

The first and second electrostatic attraction units 111 and 211 include a plurality of internal electrodes 111a and 211a, respectively. The first and second electrostatic attraction units 111 and 211 attract and hold the non-bonding surface Wn of the target substrate W and the non-bonding surface Sn of the glass substrate S on holding surfaces 113 and 213, respectively, through electrostatic forces generated in the holding surfaces 113 and 213 by means of the internal electrodes 111a and 211a.

In this manner, since the bonding unit 90 according to this embodiment uses electrostatic chucks as the first holding unit 101 and the second holding unit 201, the target substrate W and the glass substrate S can be reliably held under a vacuum atmosphere, or the like.

It may be considered to use a vacuum chuck that attracts and holds a substrate through a negative pressure, as a holding unit. However, such a holding unit has a low holding force under a reduced pressure atmosphere. For this reason, for example, the target substrate W may be dropped or dislocated or shifted in position, or for example, the glass substrate S may be dislocated or shifted in position due to a change in pressure when the interior of a chamber is depressurized, or the like. In contrast, the electrostatic chuck does not show degradation in the holding force even under a vacuum environment, reliably holding the target substrate W and the glass substrate S.

Further, when a mechanical chuck that mechanically holds a substrate is used as a holding unit, the target substrate W and the glass substrate S may be damaged. However, the target substrate W and the glass substrate S may not be damaged when using the electrostatic chuck, compared to using the mechanical chuck.

Also, it may be considered that the second holding unit 201 is configured as a vacuum chuck and a rubber pad is installed on the holding surface 213 thereof to prevent dislocation of the glass substrate S under a reduced pressure atmosphere. However, like the bonding unit 90 according to this embodiment, when a bonding process is performed under a high temperature atmosphere exceeding a heat resistance temperature of the rubber pad, the rubber pad may not be used.

The heat resistance temperature of fluorinated rubber which is known to have high heat resistance is 300 degrees C., but in the bonding system 1 according to this embodiment, the target substrate W and the glass substrate S are bonded under a high temperature atmosphere exceeding 300 degrees C. Thus, the bonding unit 90 according to this embodiment may use electrostatic chucks as both the first holding unit 101 and the second holding 201.

As illustrated in FIGS. 5A and 5B, the first holding unit 101 and the second holding unit 201 include first and second vacuum attraction units 112 and 212, respectively, in addition to the first and second electrostatic attraction units 111 and 211.

The first and second vacuum attraction units 112 and 212 include intake spaces 112a and 212a and a plurality of through holes 112b and 212b communicating from the holding surfaces 113 and 213 to the intake spaces 112a and 212a, respectively. Intake devices 115 and 215 such as vacuum pumps are connected to the intake spaces 112a and 212a through intake pipes 114 and 214, respectively.

The first and second vacuum attraction units 112 and 212 attract and hold the non-bonding surface Wn of the target substrate W and the non-bonding surface Sn of the glass substrate S on the holding surfaces 113 and 213, respectively, through negative pressures generated according to air intake of the intake devices 115 and 215.

The first holding unit 101 and the second holding unit 201 are formed of, for example, ceramics such as aluminum nitride.

Returning to FIG. 4, description of the first holding unit 101 and the second holding unit 201 will be continued. The first holding unit 101 and the second holding unit 201 are provided with a first heating mechanism 117 and a second heating mechanism 217 embedded therein, respectively. The first heating mechanism 117 heats the target substrate W held by the first holding unit 101, and the second heating mechanism 217 heats the glass substrate S held by the second holding unit 201.

Bonding of the target substrate W and the glass substrate S is performed under a reduced pressure atmosphere. For this reason, for example, a ceramic heater that may be used even under a reduced pressure atmosphere is used as the first heating mechanism 117 and the second heating mechanism 217.

In addition, the bonding unit 90 includes a first cooling mechanism 102, a base member 103, and a pressing mechanism 104.

The first cooling mechanism 102 is installed to be in contact with a surface of the first holding unit 101 opposing the holding surface 113 (see FIG. 5A). As the first cooling mechanism 102, a cooling jacket made of metal, for example, may be used. The first cooling mechanism 102 cools the first holding unit 101 through a cooling fluid medium such as cooling water, thereby cooling the target substrate W held on the first holding unit 101.

The base member 103 is installed on an upper surface of a first chamber unit 311, which will be described later, from an upper side of the first cooling mechanism 102.

The pressing mechanism 104 moves the first holding unit 101 with respect to the second holding unit 201, thereby bringing the target substrate W and the glass substrate S into contact with each other and pressing them. Specifically, the pressing mechanism 104 vertically moves the first holding unit 101 downwards to bring the target substrate W into contact with the glass substrate S and presses the target substrate W and the glass substrate S. The pressing mechanism 104 includes a pressure container 141, a gas supply pipe 142, a gas supply source 143, and a support member 144.

The pressure container 141 is configured as, for example, a vertically expandable bellows formed of stainless steel. A lower end portion of the pressure container 141 is fixed to an upper surface of the support member 144, whereas an upper end portion of the pressure container 141 is fixed to a lower surface of the base member 103.

Further, the foregoing first cooling mechanism 102 is fixedly supported by a lower surface of the support member 144. Also, for example, an insulating plate may be interposed between the support member 144 and the first cooling mechanism 102 to prevent heat generated when the target substrate W is heated by the first heating mechanism 117 from being transmitted to the support member 144.

One end of the gas supply pipe 142 is connected to the pressure container 141 through the base member 103 and the first chamber unit 311, and the other end thereof is connected to the gas supply source 143.

With such a pressure container 141, a gas is supplied from the gas supply source 143 into the pressure container 141 through the gas supply pipe 142 to expand the pressure container 141, thus lowering the first holding unit 101. Accordingly, the target substrate W is brought into contact with the glass substrate S, and the target substrate W and the glass substrate S are pressed. A pressing force exerted to the target substrate W and the glass substrate S is adjusted by adjusting pressure of the gas supplied to the pressure container 141.

Further, since the pressure container 141 has expandability, even when a difference in the degree of horizontality between the first holding unit 101 and the second holding unit 201 occurs, the difference may be absorbed by the pressure container 141. Also, the pressure container 141 may uniformly press the target substrate W and the glass substrate S because the interior of the pressure container 141 is uniformly pressurized by the gas.

In addition, the bonding unit 90 includes a second cooling mechanism 202 and an insulating plate 203. The second cooling mechanism 202 has a disc-like shape having a diameter substantially equal to that of the second holding unit 201, for example. The second cooling mechanism 202 is installed to be in contact with a surface of the second holding unit 201 of the second holding unit 201 opposite the holding surface 213 (see FIG. 5B). Like the first cooling mechanism 102, a cooling jacket formed of, for example, metal may be used as the second cooling mechanism 202. The second cooling mechanism 202 cools the second holding unit 201 through a cooling fluid medium such as cooling water, thereby cooling the glass substrate S held on the second holding unit 201.

Although the bonding unit 90 as described above includes the first and second cooling mechanisms 102 and 202, any one or both of the first and second cooling mechanisms 102 and 202 may be removed.

The insulating plate 203 is interposed between a lower surface of the second cooling mechanism 202 and a second chamber unit 312 as described later. Accordingly, the insulating plate 203 may prevent heat from being generated when the glass substrate S is heated by the second heating mechanism 217 from being transmitted to the second chamber unit 312. The insulating plate 203 may be made of, for example, silicon nitride or the like.

The bonding unit 90 further includes a chamber 301, a moving mechanism 302, a depressurizing mechanism 303, a gas supply mechanism 304, a first imaging unit 305, and a second imaging unit 306.

The chamber 301 is a process container whose interior may be hermetically closed, and includes the first chamber unit 311 and the second chamber unit 312. The first chamber unit 311 is a bottomed cylindrical container with an opened lower portion, and accommodates the first holding unit 101, the target substrate W, the first cooling mechanism 102, the pressure container 141, and the like therein. Also, the second chamber unit 312 is a bottomed cylindrical container with an opened upper portion, and accommodates the second holding unit 201, the glass substrate S, the second cooling mechanism 202, and the like therein.

The first chamber unit 311 is configured to move in a vertical direction by an elevating mechanism (not shown) such as an air cylinder. By lowering the first chamber unit 311 by means of the elevating mechanism to make the first chamber unit 311 and the second chamber unit 312 come into contact with each other, a hermetically closed space is formed within the chamber 301. Further, a seal member 313 for securing airtightness of the chamber 301 is installed in a contact surface of the first chamber unit 311 with the second chamber unit 312. An O-ring, for example, is used as the seal member 313.

The moving mechanism 302 is installed in an outer peripheral portion of the first chamber unit 311, and moves the first holding unit 101 in the horizontal direction through the first chamber unit 311. A plurality of moving mechanisms 302 may be installed in the outer peripheral portion of the first chamber unit 311. For example, in a case where five moving mechanisms 302 are installed in the outer peripheral portion of the first chamber unit 311, four of the five moving mechanisms 302 may move the first holding unit 101 in the horizontal direction, whereas the remaining moving mechanism 302 rotates the first holding unit 101 about the vertical axis.

The moving mechanism 302 includes a cam 321, which is in contact with the outer peripheral portion of the first chamber unit 311 and configured to move the first holding unit 101, and a rotation driving unit 323 for rotating the cam 321 through a shaft 322. The cam 321 is eccentrically installed with respect to a central axis of the shaft 322. By rotating the cam 321 by means of the rotation driving unit 323, a central position of the cam 321 with respect to the first holding unit 101 may be moved to thereby move the first holding unit 101 in the horizontal direction.

The depressurizing mechanism 303 is installed, for example, in a lower portion of the second chamber unit 312, and depressurizes the interior of the chamber 301. The depressurizing mechanism 303 includes an intake pipe 331 for sucking an atmosphere within the chamber 301, and first and second intake devices 332 and 333 such as vacuum pumps connected to the intake pipe 331.

The first intake device 332 has a function of sucking the atmosphere within the chamber 301 to depressurize the interior of the chamber 301 to a first pressure Pc1 (for example, 1 Pa). Meanwhile, the second intake device 333 has a function of sucking the atmosphere within the chamber 301 to depressurize the interior of the chamber 301 to a second pressure Pc2 (for example, less than 1 Pa) lower than the first pressure Pc1. That is, the second intake device 333 is set to have an intake force stronger than that of the first intake device 332.

The gas supply mechanism 304 is installed, for example, in a lower portion of the second chamber unit 312, and supplies an inert gas, for example, a nitrogen gas, into the chamber 301. The gas supply mechanism 304 includes a gas supply pipe 341 for supplying an inert gas into the chamber 301 and a gas supply source 342 connected to the gas supply pipe 341.

The first imaging unit 305 is disposed below the first holding unit 101 and images a surface of the target substrate W held on the first holding unit 101. Also, the second imaging unit 306 is disposed above the second holding unit 201 and images a surface of the glass substrate S held on the second holding unit 201.

The first imaging unit 305 and the second imaging unit 306 are configured to be movable in the horizontal direction by a moving mechanism (not shown), and introduced into the chamber 301 before the first chamber unit 311 is lowered, thereby imaging the target substrate W and the glass substrate S. The image data from the first imaging unit 305 and the second imaging unit 306 are transmitted to the control device 5. Wide-angle CCD (Charge-Coupled Device) cameras, for example, may be used as the first imaging unit 305 and the second imaging unit 306.

<4. Operation of Bonding Unit>

Figure 6A:
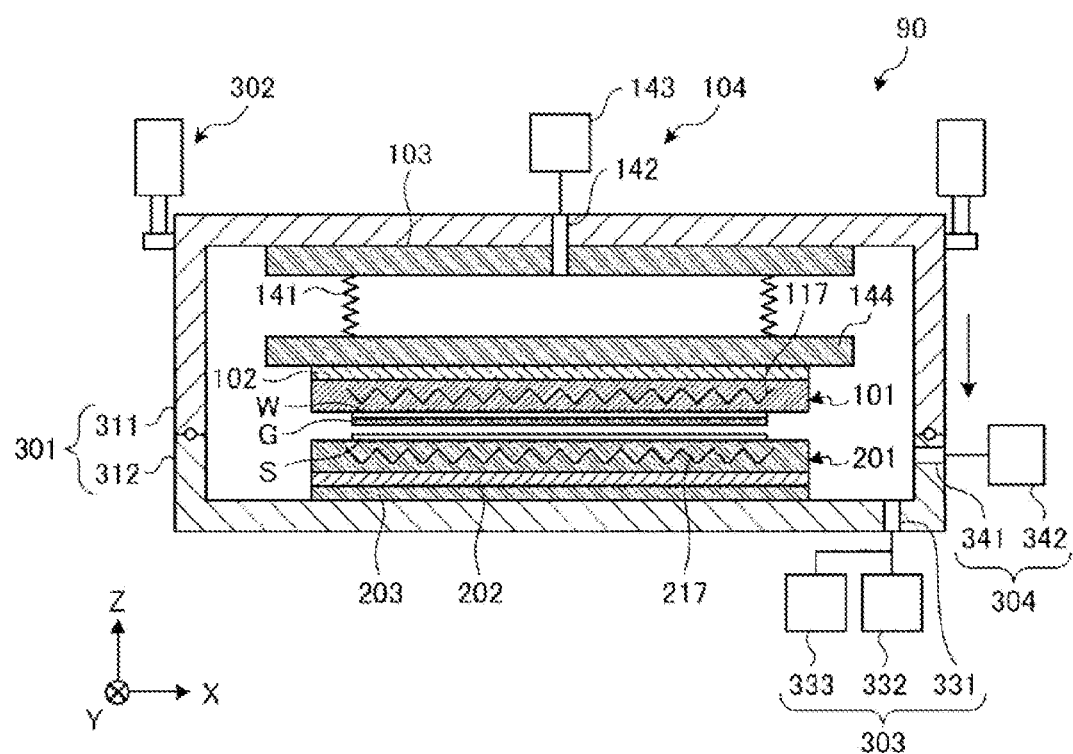
FIGS. 6A and 6B are explanatory views illustrating operation examples of bonding processing.
Figure 6B:
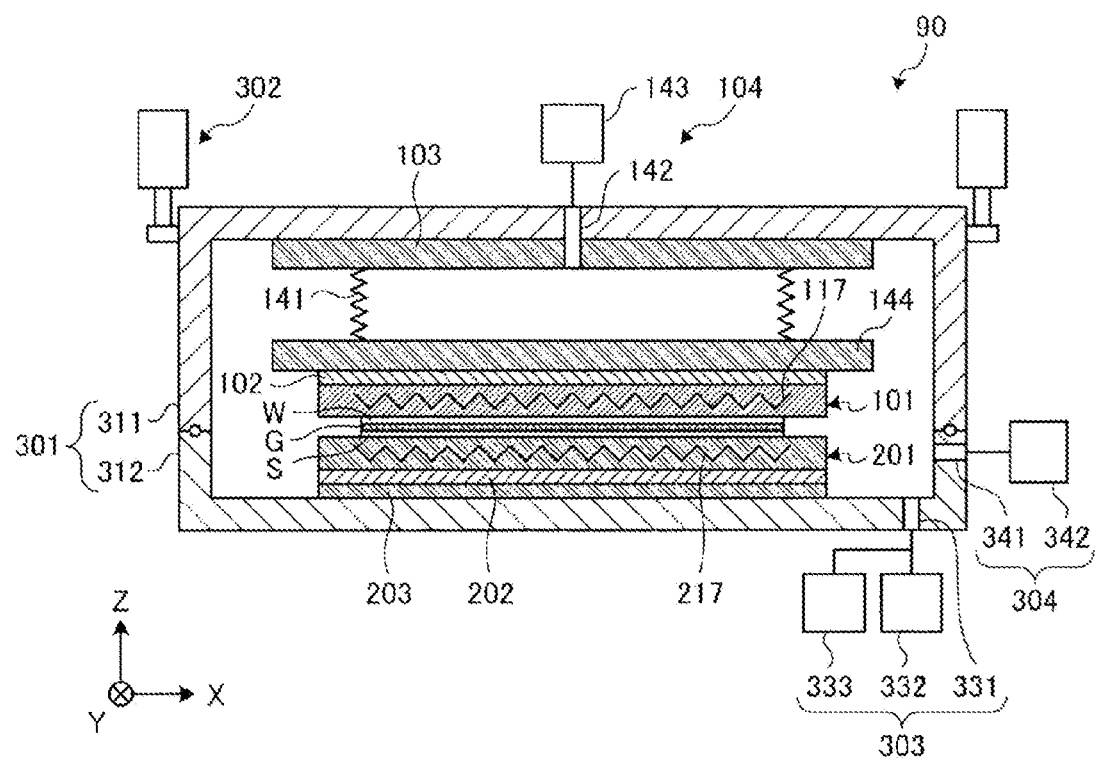

Next, a sequence of the bonding process executed by the bonding unit 90 configured as described above will be described with reference to FIGS. 6A and 6B. FIGS. 6A and 6B are explanatory views illustrating operation examples of bonding processing.

In the bonding unit 90, first, the target substrate W is held by the first holding unit 101 and the glass substrate S is held by the second holding unit 201. At this time, the first holding unit 101 and the second holding unit 201 have already been heated by the first heating mechanism 117 of the first holding unit 101 and the second heating mechanism 217 of the second holding unit 201 to have first temperatures Ta1 and Tb1, respectively. Both the first temperature Ta1 of the first heating mechanism 117 and the first temperature Tb1 of the second heating mechanism 217 are relatively low temperatures, for example, temperatures below 200 degrees C. at which the glue G is not softened.

Subsequently, an alignment process is performed in the bonding unit 90. During the alignment process, the first imaging unit 305 and the second imaging unit 306 as illustrated in FIG. 4 are moved in the horizontal direction to enter the chamber 301, and image the surfaces of the target substrate W and the glass substrate S, respectively.

Thereafter, a position of the target substrate W in the horizontal direction is adjusted by the moving mechanism 302 such that a position of a reference point of the target substrate W shown in the image captured by the first imaging unit 305 and a position of a reference point of the glass substrate S shown in the image captured by the second imaging unit 306 are made consistent. In this manner, the horizontal position of the target substrate W with respect to the glass substrate S is adjusted.

Subsequently, the first imaging unit 305 and the second imaging unit 306 are removed from the chamber 301. Then, the first chamber unit 311 is lowered by a moving mechanism (not shown) and the first chamber unit 311 is brought into contact with the second chamber unit 312, thereby forming a hermetically closed space within the chamber 301 (see FIG. 6A).

Subsequently, a heating process is performed in the bonding unit 90. During the heating process, the target substrate W and the glass substrate S are heated by the first heating mechanism 117 of the first holding unit 101 and the second heating mechanism 217 of the second holding unit 201, respectively. During the temperature increasing process, temperatures of the first heating mechanism 117 and the second heating mechanism 217 are increased from the first temperatures Ta1 and Tb1 to second temperatures Ta2 and Tb2, respectively, and accordingly, the temperatures of the target substrate W and the glass substrate S are also increased to the second temperatures Ta2 and Tb2, respectively. Both the second temperatures Ta2 and Tb2 are relatively high temperatures, for example, temperatures equal to or above 300 degrees C. at which the glue G is softened.

Also, during the heating process, an inert gas is supplied from the gas supply mechanism 304 into the chamber 301, rendering the interior of the chamber 301 to have an inert atmosphere. That is, heating of the target substrate W and the glass substrate S as described above is performed within the chamber 301 maintained in the inert atmosphere. Accordingly, for example, oxidation of the glue G coated on the bonding surface Wj of the target substrate W may be suppressed.

Thereafter, a depressurizing process is performed in the bonding unit 90. During the depressurizing process, the atmosphere within the chamber 301 is sucked by the depressurizing mechanism 303, so that the interior of the chamber 301 is depressurized. Specifically, during the depressurizing process, the interior of the chamber 301 is first depressurized to the first pressure Pc1 by means of the first intake device 332 and, thereafter, the interior of the chamber 301 is further depressurized to the second pressure Pc2 by means of the second intake device 333.

Subsequently, a bonding process is performed in the bonding unit 90. During the bonding process, a gas is supplied into the pressure container 141 to make the interior of the pressure container 141 have a desired pressure. Accordingly, the first holding unit 101 is lowered to press the target substrate W and the glass substrate S with a desired pressure (pressing force Pb2 to be described later) (see FIG. 6B).

The glue G coated on the bonding surface Wj of the target substrate W is softened as the temperature of the target substrate W is increased to the second temperature Ta2, and the target substrate W and the glass substrate S are bonded by the glue G as the target substrate W presses the glass substrate S with the desired pressure. Also, since the interior of the chamber 301 is adjusted to have the depressurized atmosphere, generation of a void between the target substrate W and the glass substrate S may be prevented.

Subsequently, a cooling process is performed in the bonding unit 90 by means of the first cooling mechanism 102 and the second cooling mechanism 202. During the cooling process, while the target substrate W and the glass substrate S are maintained in a pressed state by the pressing mechanism 104, the temperatures of the first and second heating mechanisms 117 and 217 are decreased to the first temperatures Ta1 and Tb1 by the first and second cooling mechanisms 102 and 202, respectively. Accordingly, the temperatures of the target substrate W and the glass substrate S are also decreased to the first temperatures Ta1 and Tb1, respectively, and thus, the softened glue G is hardened to thereby bond the target substrate W and the glass substrate S. Also, during the cooling process, an inert gas is supplied from the gas supply mechanism 304 into the chamber 301, and accordingly, oxidation of the glue G, for example, may be suppressed.

After the first chamber unit 311 is lifted by the moving mechanism (not shown), the superposed substrate T formed in the above described manner is unloaded from the bonding unit 90 by the transfer unit 80 and carried to the cassette Ct in the foregoing order.

<5. Operation of Second Holding Unit>

In the bonding system 1 according to this embodiment, the glass substrate S is used as a support substrate, and an electrostatic chuck is used as the second holding unit 201 for holding the glass substrate S. Also, in the bonding system 1 according to this embodiment, as described above, the temperature of the glass substrate S is increased to the second temperature Tb2 which is a relatively high temperature.

Further, in order to allow the second holding unit 201 to electrostatically attract and hold the glass substrate S, a voltage is applied to the second holding unit 201. Thus, if a period of time lapses under a state where the glass substrate S is electrostatically held by means of the second holding unit 201 as an electrostatic chuck and where the temperature of the glass substrate S is increased to reach a relatively high level, sodium ions in the glass substrate S may move to the contact surface with the second holding unit 201 and go out of the glass substrate S.

Specifically, for example, when the glass substrate S is electrostatically held for a relatively long period of time from the alignment process to the bonding process by maintaining the second electrostatic attraction unit 211 of the second holding unit 201 in an ON state, sodium may be extracted from the glass substrate S. The extraction of sodium may cause defects such as degradation of the surface of the second holding unit 201 or corruption of the glass substrate S.

However, for example, since the glass substrate S may be dislocated with respect to the second holding unit 201 when a pressure within the chamber 301 is changed during the depressurizing process, the glass substrate S needs to be reliably held by the second holding unit 201 through electrostatic attraction.

Thus, in the bonding system 1 according to this embodiment, the glass substrate S is held through electrostatic attraction when there is a possibility that the glass substrate S is dislocated with respect to the second holding unit 201, and in other cases, the electrostatic attraction is released to suppress the extraction of sodium.

The foregoing extraction of sodium occurs due to an overlap of a plurality of factors, for example, a temperature of the glass substrate S, a voltage applied to the electrostatic chuck and a time duration in which the voltage is applied to the electrostatic chuck. For this reason, in this embodiment, for example, the voltage applied to the electrostatic chuck is set to have a minimum value allowing for the electrostatic attraction, and the time duration for applying the voltage, i.e., the time duration in which the glass substrate S is electrostatically held by the second holding unit 201, is shortened, thus suppressing the extraction of sodium.

Hereinafter, a timing for holding the glass substrate S by the second holding unit 201 through electrostatic attraction will be described in detail with reference to FIG. 7. FIG. 7 is a timing chart illustrating a substrate bonding sequence according to this embodiment.

As illustrated in FIG. 7, first, the foregoing alignment process is performed in the bonding unit 90. During the alignment process, the second electrostatic attraction unit 211 of the second holding unit 201 is turned off. That is, the glass substrate S is held by the holding surface 213 by seating. More specifically, the glass substrate S is seated on the holding surface 213 and held by a negative pressure generated by the second vacuum attraction unit 212. At this time, the first electrostatic attraction unit 111 in the first holding unit 101 is turned on to allow the target substrate W to be held through electrostatic attraction.

After the alignment process is terminated, the first chamber unit 311 is lowered and an inert gas is supplied into the chamber 301. Then, the temperatures of the target substrate W and the glass substrate S are increased to the second temperatures Ta2 and Tb2 by means of the first and second heating mechanisms 117 and 217.

Subsequently, the depressurizing process is performed in the bonding unit 90, in which the interior of the chamber 301 starts to be depressurized by means of the first intake device 332. When the depressurization is started by the first intake device 332, the pressure within the chamber 301 is changed, resulting in an increase of airflow within the chamber 301. In this disclosure, the timing at which the pressure within the chamber 301 starts to be changed as described above will be referred to as a "pressure change timing", and the pressure change timing is indicated by a reference symbol "A1" in FIG. 7.

At the pressure change timing A1, since the pressure within the chamber 301 is steeply changed, the glass substrate S seated on the holding surface 213 may be dislocated with respect to the second holding unit 201. Thus, as illustrated in FIG. 7, holding of the glass substrate S by the second holding unit 201 is changed from holding based on seating to holding based on electrostatic attraction, during a predetermined period of time B1 including the pressure change timing A1. Specifically, the second electrostatic attraction unit 211 is turned on during the period of time B1.

Accordingly, the glass substrate S may be reliably held by the second holding unit 201 through electrostatic attraction, thereby preventing dislocation of the glass substrate S.

Also, a voltage applied to an electrostatic chuck as the second holding unit 201 is set to have, for example, a minimum value allowing for the electrostatic attraction. Specifically, for example, the voltage applied to the electrostatic chuck constituting the second holding unit 201 is set to a value lower than that of a voltage applied to an electrostatic chuck constituting the first holding unit 101. Accordingly, extraction of sodium from the glass substrate S may be effectively suppressed.

Sodium in the glass substrate S may be easily extracted in proportion to the voltage applied to the electrostatic chuck. However, as mentioned above, the extraction of sodium may be effectively suppressed by setting the voltage applied to the electrostatic chuck to have the minimum value allowing for electrostatic attraction.

Further, the foregoing predetermined period of time B1 is set to cover the duration of time before and after the pressure change timing A1. Specifically, for example, the predetermined period of time B1 is set to start 20 to 40 seconds before the pressure change timing A1 and terminate 20 to 40 seconds after the pressure change timing A1, i.e., approximately 40 to 80 seconds in total. Although the predetermined period of time B1 is set to be within the specific numerical range in the above example, it is merely illustrative and the present disclosure is not limited thereto. For example, the predetermined period of time B1 may be less than 40 seconds or greater than 80 seconds.

After the lapse of the predetermined period of time B1, the holding of the glass substrate S by the holding unit 201 is switched from the holding based on electrostatic attraction to the holding based on seating. Specifically, the second electrostatic attraction unit 211 is turned off.

Thereafter, during the depressurizing process, the interior of the chamber 301 starts to be depressurized by using the second intake device 333. When the depressurization by the second intake device 333 is started, the pressure within the chamber 301 is changed, like the depressurization by the first intake device 332. In FIG. 7, a pressure change timing according to the depressurization by the second intake device 333 is indicated by a reference symbol "A2".

Like the pressure change timing A1, the pressure within the chamber 301 is steeply changed at the pressure change timing A2, such that the glass substrate S seated on the holding surface 213 may be dislocated. Thus, the holding of the glass substrate S by the second holding unit 201 is changed from holding based on seating to holding based on electrostatic attraction during a predetermined period of time B2 including the pressure change timing A2. Specifically, the second electrostatic attraction unit 211 is again turned on.

Accordingly, the glass substrate S may be reliably held by the second holding unit 201 through electrostatic attraction, thereby preventing dislocation of the glass substrate S.

The predetermined period of time B2 is set to cover the before and after of the pressure change timing A2. For example, the predetermined period of time B2 is set to start 20 to 40 seconds before the pressure change timing A2 and terminate 20 to 40 seconds after the pressure change timing A2, i.e., approximately 40 to 80 seconds in total. However, the aforementioned numerical range is merely illustrative and the present disclosure is not limited thereto.

After the lapse of the foregoing predetermined period of time B2, the second electrostatic attraction unit 211 is turned off, and the holding of the glass substrate S by the second holding unit 201 is switched from the holding based on electrostatic attraction to the holding based on seating.

When the interior of the chamber 301 is depressurized to, for example, the second pressure Pc2 by the depressurizing process, a bonding process is performed in the bonding unit 90. Even after the bonding process starts, the depressurization of the interior of the chamber 301 by the first and second intake devices 332 and 333 continues.

During the bonding process, the first holding unit 101 is lowered by using the pressing mechanism 104 to bring the target substrate W into contact with the glass substrate S. In this disclosure, a timing at which the target substrate W and the glass substrate S are brought into contact with each other as described above will be referred to as a "contact timing", and the contact timing is indicated by a reference symbol "A3" in FIG. 7.

A pressing force exerted on the target substrate W and the glass substrate S at the contact timing A3 is set to a pressing force Pb1, which is lower than the pressing force Pb2 exerted when the target substrate W and the glass substrate S are bonded as described later. Specifically, the pressing force Pb1 is equal to, for example, an atmospheric pressure.

Thereafter, during the bonding process, the target substrate W and the glass substrate S are pressed with the pressing force Pb2 so as to be bonded. Here, a timing at which the target substrate W and the glass substrate S are pressed as described above will be referred to as a "pressing timing" and the pressing timing is indicated by a reference symbol "A4" in FIG. 7.

At the pressing timing A4, the glass substrate S seated on the holding surface 213 may be dislocated due to a pressing force applied to the target substrate W and the glass substrate S. Thus, as illustrated in FIG. 7, the holding of the glass substrate S by the second holding unit 201 is switched from the holding based on seating to the holding based on electrostatic attraction during a predetermined period of time B4 including the pressing timing A4. Specifically, the second electrostatic attraction unit 211 is turned on.

Accordingly, the glass substrate S may be reliably held by the second holding unit 201 through electrostatic attraction, thereby preventing dislocation of the glass substrate S.

The predetermined period of time B4 is set to cover the duration of time before and after the pressing timing A4. For example, the predetermined period of time B4 is set to start 20 to 40 seconds before the pressing timing A4 and terminate 20 to 40 seconds after the pressing timing A4, i.e., approximately 40 to 80 seconds in total. However, the aforementioned numerical range is merely illustrative and the present disclosure is not limited thereto.

As described above, the foregoing predetermined periods of time B1, B2 and B4 are set to start before the pressure change timings A1 and A2 and the pressing time A4, respectively. Due to this, the holding of the glass substrate S by electrostatic attraction by the second holding unit 201 starts before the pressure change timings A1 and A2 and the pressing timing A4.

Accordingly, for example, even when a delay (time lag) occurs after the second electrostatic attraction unit 211 is turned on and before the glass substrate S is actually electrostatically held, the glass substrate S may be held by electrostatic attraction at the pressure change timings A1 and A2 and the pressing timing A4. Therefore, the dislocation of the glass substrate S may be reliably prevented.

Further, in the bonding unit 90, the depressurization within the chamber 301 by the first and second intake devices 332 and 333 is stopped at the pressing timing A4. When the depressurization within the chamber 301 is stopped, the pressure within the chamber 301 is changed to easily cause dislocation of the glass substrate S. However, as described above, since the glass substrate S is held by electrostatic attraction at the pressing timing A4, dislocation of the glass substrate S does not occur.

In the aforementioned manner, the pressing of the glass substrate S and the stop of the depressurization within the chamber 301, which easily causes dislocation of the glass substrate S, are performed at almost the same time (specifically, at the pressing time A4). Accordingly, by simply holding the glass substrate S through electrostatic attraction during the predetermined period of time B4 including the pressing timing A4, dislocation of the glass substrate S due to the pressing and due to the pressure change may be prevented.

If the pressing of the glass substrate S and the stopping of the depressurization within the chamber 301 are executed at different timings, electrostatic holding needs to be performed twice, i.e., once for each timing. However, through the configuration as described above, electrostatic holding needs to be performed once, which shortens a total time duration of the electrostatic holding. Accordingly, the extraction of sodium may be further suppressed.

After the lapse of the foregoing predetermined period of time B4, the holding of the glass substrate S by the holding unit 201 is switched from the holding by electrostatic attraction to the holding by seating. Specifically, the second electrostatic attraction unit 211 is turned off. Also, the first electrostatic attraction unit 111 of the first holding unit 101 is turned off.

Thereafter, the foregoing cooling process is performed in the bonding unit 90. Then, the superposed substrate T formed by bonding the target substrate W and the glass substrate S is unloaded from the bonding unit 90, and the series of the substrate bonding sequence is terminated.

By limiting the time duration for which the second holding unit 201 electrostatically holds the glass substrate S to the predetermined periods of time B1, B2 and B4, the time duration for the electrostatic holding may be shortened, for example, compared to a case where electrostatic holding continues from the alignment process to the bonding process. Accordingly, the extraction of sodium from the glass substrate S may be suppressed.

In the above embodiment, electrostatic holding is performed during the predetermined periods of time B1, B2 and B4 including the pressure change timings A1 and A2 and the pressing timing A4. However, as indicated by a dashed line in FIG. 7, electrostatic holding may also be performed during a predetermined period of time B3 including the contact timing A3. In this case, for example, dislocation of the glass substrate S at the contact timing A3 at which the target substrate W and the glass substrate S are brought into contact with each other may be prevented.

The foregoing predetermined period of time B3 is set to cover the duration of time before and after the contact timing A3. For example, the predetermined period of time B3 is set to start 20 to 40 seconds before the contact timing A3 and terminate 20 to 40 seconds after the contact timing A3, i.e., approximately 40 to 80 seconds in total. However, the aforementioned numerical range is merely illustrative and the present disclosure is not limited thereto.

In the above embodiment, the depressurizing mechanism 303 includes the first intake device 332 and the second intake device 333. However, the second intake device 333 may be removed, and the depressurizing mechanism 303 may include the first intake device 332 only. When the second intake device 333 is removed, electrostatic holding does not need to be performed during the predetermined period of time B2 including the pressure change timing A2, which shortens a total time duration for electrostatic holding by the predetermined period of time B2. Accordingly, the extraction of sodium from the glass substrate S may be further suppressed.

In the above embodiment, electrostatic holding is performed during the predetermined periods of time B1, B2 and B4. However, electrostatic holding may be performed during at least one of the predetermined periods of time B1, B2 and B4. By doing so, a total time for electrostatic holding may be further shortened by the predetermined periods of time during which electrostatic holding is not performed, thus further suppressing the extraction of sodium from the glass substrate S.

As described above, the bonding method according to the present disclosure includes a first holding process, a second holding process, the depressurizing process, and the bonding process. During the first holding process, the target substrate W is held. During the second holding process, the glass substrate S is seated or held through electrostatic attraction. During the depressurizing process, the interior of the chamber for accommodating the target substrate W and the glass substrate S is depressurized. During the bonding process, the target substrate W and the glass substrate S are brought into contact with each other, and are pressed so as to be bonded to each other. In the second holding process, the holding of the glass substrate S is switched from the holding based on seating to the holding based on electrostatic attraction, during at least one of the predetermined periods of time B1 and B2 including the pressure change timings A1 and A2 at which the pressure within the chamber is changed in the depressurizing process and the predetermined period of time B4 including the pressing timing A4 at which the target substrate W and the glass substrate S are pressed in the bonding process.

Thus, through the bonding method according to the present disclosure, extraction of sodium from the glass substrate S may be suppressed.

In the above embodiment, in the bonding unit 90, the target substrate W and the glass substrate S are heated to reach the second temperatures Ta2 and Tb2, respectively, during the heating process. However, the target substrate W and the glass substrate S having a temperature increased to the second temperatures Ta2 and Tb2 in advance may be transferred to the bonding unit 90, thus omitting the heating process.

Further, in the foregoing embodiment, after the glue G is coated on the target substrate W and heat treatment is performed thereon in the coating/heating process block G1, the target substrate W and the glass substrate S are bonded in the bonding process block G2. However, when preparing a target substrate W coated with the glue G in advance, the process preformed in the coating/heating process block G1 may be omitted. Also, in this case, the bonding system 1 may not necessarily have the coating/heating process block G1.

Moreover, in the foregoing embodiment, the control device 5 controls the first holding unit 101, the second holding unit 201, the pressing mechanism 104 and the like provided in the bonding apparatus 45. However, the bonding apparatus 45 may have a controller for controlling the first holding unit 101, the second holding unit 201, the pressing mechanism 104 and the like.

According to a bonding method, a bonding apparatus, and a bonding system of the present disclosure, the extraction of sodium from a glass substrate can be prevented.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A bonding method, comprising:
holding a substrate to be processed by a first holding unit;
holding a glass substrate by a second holding unit in a first holding state of seating the glass substrate on the second holding unit or in a second holding state of electrostatically attracting the glass substrate toward the second holding unit;
depressurizing the interior of a chamber for accommodating the substrate to be processed held by the first holding unit and the glass substrate held by the second holding unit; and
bringing the substrate to be processed and the glass substrate into contact with each other and pressing the substrate to be processed and the glass substrate to bond the substrate to be processed and the glass substrate,
wherein depressurizing the interior of a chamber includes:
a first depressurizing process of depressurizing the interior of the chamber to a first pressure using a first intake device, and, after the first depressurizing;
a second depressurizing process of depressurizing the interior of the chamber to a second pressure lower than the first pressure using a second intake device, and
wherein holding a glass substrate includes:
switching from the first holding state to the second holding state during at least one predetermined period of time selected from a plurality of predetermined periods of time, the plurality of predetermined periods of time including both a pressure change timing at which the pressure within the chamber is changed in the first depressurizing process and a pressure change timing at which the pressure within the chamber is changed in the second depressurizing process, and a pressing timing at which the substrate to be processed and the glass substrate are pressed in bonding the substrate to be processed and the glass substrate.

2. The bonding method of claim 1, wherein holding a glass substrate includes:
starting the second holding state before the pressure change timings and the pressing timing.

3. The bonding method of claim 1, wherein depressurizing the interior of a chamber includes:
starting the depressurization of the interior of the chamber before the pressing timing and stopping the depressurization of the interior of the chamber at the pressing timing.

4. The bonding method of claim 1, further comprising:
heating the substrate to be processed and the glass substrate.

5. A bonding method, comprising:
holding a substrate to be processed by a first holding unit;
holding a glass substrate by a second holding unit in a first holding state of seating the glass substrate on the second holding unit or in a second holding state of electrostatically attracting the glass substrate toward the second holding unit;

depressurizing the interior of a chamber for accommodating the substrate to be processed held by the first holding unit and the glass substrate held by the second holding unit; and bringing the substrate to be processed and the glass substrate into contact with each other and pressing the substrate to be processed and the glass substrate to bond the substrate to be processed and the glass substrate, wherein holding a glass substrate includes:

switching from the first holding state to the second holding state during at least one predetermined period of time selected from a plurality of predetermined periods of time, the plurality of predetermined periods of time including a pressure change timing at which a pressure within the chamber is changed in depressurizing the interior of a chamber, a pressing timing at which the substrate to be processed and the glass substrate are pressed in bonding the substrate to be processed and the glass substrate and a contact timing at which the substrate to be processed and the glass substrate are brought into contact with each other in bonding the substrate to be processed and the glass substrate.

6. The bonding method of claim 5, wherein holding a glass substrate includes:

starting the second holding state before the pressure change timing, the pressing timing and the contact timing.

7. The bonding method of claim 5, wherein depressurizing the interior of a chamber includes:

starting the depressurization of the interior of the chamber before the pressing timing and stopping the depressurization of the interior of the chamber at the pressing timing.

8. The bonding method of claim 5, further comprising:

heating the substrate to be processed and the glass substrate.

* * * * *